United States Patent [19]

Kohno

[11] Patent Number: 5,548,144

[45] Date of Patent: Aug. 20, 1996

[54] RECESSED GATE FIELD EFFECT TRANSISTOR

[75] Inventor: Yasutaka Kohno, Itami, Japan

[73] Assignee: Mitsubishi Denki Kabushiki Kaisha, Tokyo, Japan

[21] Appl. No.: 205,180

[22] Filed: Mar. 3, 1994

[30] Foreign Application Priority Data

Mar. 5, 1993 [JP] Japan .................................. 5-044868

[51] Int. Cl.⁶ .......................... H01L 29/80; H01L 31/112
[52] U.S. Cl. .......................... 257/284; 257/280; 257/282; 257/283
[58] Field of Search .................................. 257/280, 282, 257/283, 284

[56] References Cited

U.S. PATENT DOCUMENTS 4,939,557   7/1990   Pao et al. ................................. 257/284

FOREIGN PATENT DOCUMENTS

| 0252888 | 1/1988 | European Pat. Off. | 257/282 |
| 0385031 | 9/1990 | European Pat. Off. | 257/284 |
| 0484096 | 5/1992 | European Pat. Off. | 257/282 |
| 56-122759 | 9/1981 | Japan | 257/284 |
| 60-28275 | 2/1985 | Japan | 257/283 |
| 61-99380 | 5/1986 | Japan | 257/283 |
| 63-174374 | 7/1988 | Japan | 257/282 |
| 1260861 | 10/1989 | Japan | 257/282 |
| 3-21031 | 1/1991 | Japan | 257/283 |
| 3-239337 | 10/1991 | Japan | 257/284 |
| 439941 | 2/1992 | Japan | 257/283 |

OTHER PUBLICATIONS

Proceedings of the 11th Conference (1979 International) on Solid State Devices, Tokyo 1979, Japanese Journal of Applied Physics, vol. 19 (1980) Supplement 19–1, pp. 339–343, "Power GaAs MESFETs with a Graded Recess Structure" by Higashisaka et al.

Wong et al, "A Self–Aligned Double Recessed, Sub–Half Micron Gate Process For MMIC's Using DUV Or E–Beam Lithography", Proceedings of . . . The Electrochemical Society, vol. 91–1, 1991, pp. 78–89.

Macksey, "Optimization Of The n⁺ Ledge Channel Structure For GaAs Power FET's", IEEE Transactions on Electron Devices, vol. ED–33, No. 11, 1986, pp. 1818–1824.

Tiwari et al., "Physical and Materials Limications on Burn-out Voltage of GaAs Powr MESFET's", 8093 IEEE Trans. on Electron Devices, vol. ED–27, No. 6, Jun. 1980.

Primary Examiner—Steven H. Loke
Attorney, Agent, or Firm—Leydig, Voit & Mayer

[57] ABSTRACT

A high power output semiconductor device having a plurality of FET elements on a semi-insulating semiconductor substrate including a first conductivity type semiconductor layer on the semi-insulating semiconductor substrate, a plurality of source and drain electrodes alternatingly arranged on the semiconductor layer, a plurality of gate electrodes respectively disposed in gate recesses formed by etching respective surface regions of the semiconductor layer between each adjacent source and drain electrodes. The gate recess has a asymmetrical two-stage recess structure having a second bottom surface only at the source side of the recess at a depth between a first bottom surface in contact with the gate electrode and the upper surface of the semiconductor layer and is not in contact with the gate electrode. Therefore, the thickness of the active layer at the source side is increased as compared with that in the one-stage recess structure, with the result that the source resistance is reduced because of an increase in the thickness of the active layer at the source side region while avoiding deterioration of the gate drain breakdown voltage due to an increase in the thickness of the active layer at the drain side region.

3 Claims, 12 Drawing Sheets

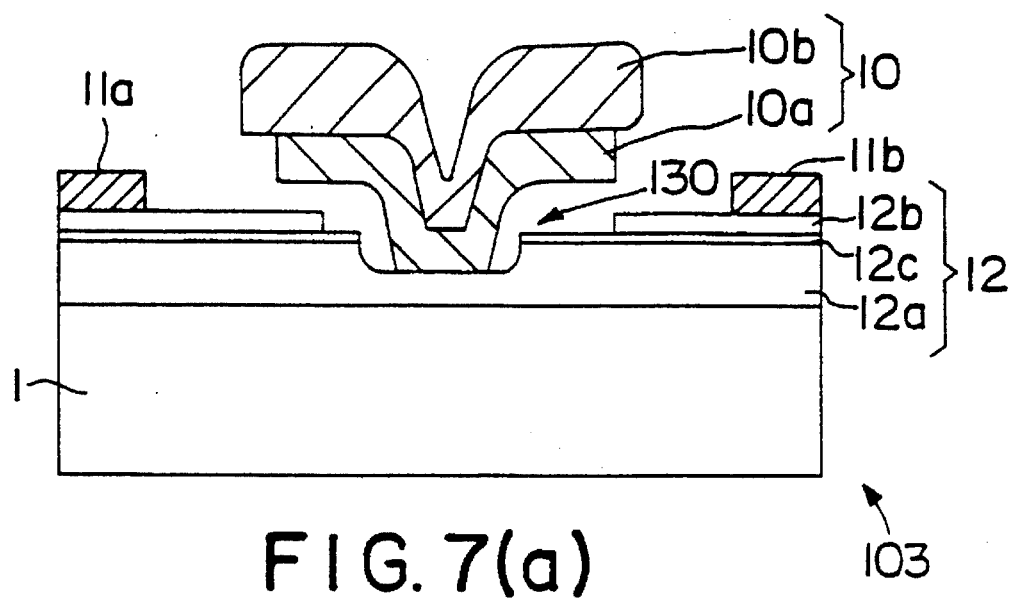
F I G. 7(a)
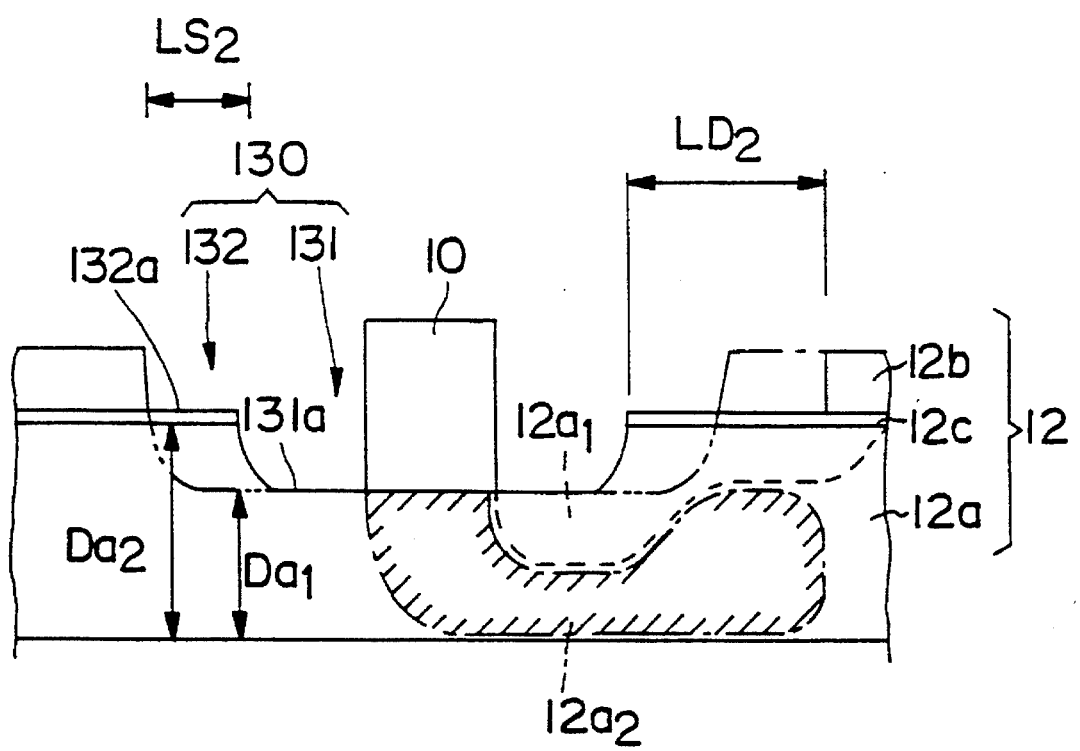
F I G. 7(b)

RECESSED GATE FIELD EFFECT TRANSISTOR

FIELD OF THE INVENTION

The present invention relates to a semiconductor device and a production method and, more particularly, to a structure of a recess (hereinafter referred to as a gate recess) in which a gate electrode is disposed in a field effect transistor (hereinafter referred to as FET) and a method of forming the gate recess.

BACKGROUND OF THE INVENTION

FIGS. 9 and 10(a)–10(h) are views for describing a two-stage recess structure FET described in Proceedings of SOTAPOCS XIII, page 79, where FIG. 9 is a cross-sectional view showing a structure of a gate electrode part of the FET and FIGS. 10(a)–10(h) are cross-sectional views showing major process steps in the production of the gate.

In the figures, reference numeral 200 designates an FET having a two-stage recess structure. An n type GaAs layer 22 is disposed on a GaAs substrate 20 and a GaAs buffer layer 21, and a gate electrode 30 is disposed at the center of a gate recess 201 in a prescribed region on the n type GaAs layer 22. The gate recess 201 has a two-stage recess structure having a first recess bottom surface 201a at the central portion of the recess in contact with the gate electrode 30 and second recess bottom surfaces 201b at both sides of the first recess bottom surface 201a. The second recess bottom surfaces 201b are positioned at a depth between the first recess bottom surface 201a and the upper surface of the n type GaAs layer 22 and are not in contact with the gate electrode 30.

High dopant concentration n type GaAs layers 23 are disposed on the upper surface of the n type GaAs layer 22 at both sides of the gate recess 201 and source and drain electrodes 25a and 25b are disposed on these n type GaAs layers 23. The upper surfaces of the n type GaAs layers 23 and the source and drain electrodes 25a and 25b are covered with SiO$_2$ films 24, and a passivation film 31 comprising an SiN film is disposed on the entire surfaces of the SiO$_2$ films 24, the n type GaAs layer 22, and the gate electrode 30.

In addition, a mask layer 25 comprising a polyimide film is provided for evaporation and lift-off of a gate electrode material. Ni layers 29 are provided for patterning the mask layer 25. An Au layer 26 is provided as a feeding layer while forming the Ni layers 29 by selective plating. A photoresist mask 28 is provided to perform the Ni plating selectively. A Ti thin film 27 disposed between the Au layer 26 and the photoresist mask 28 is provided to enhance adhesion between the photoresist mask 28 and the Au layer 26 and to reduce reflection during exposure of a photoresist film 28a.

In the production method, first of all, the GaAs buffer layer 21, the n type GaAs layer 22, and the high concentration n type GaAs layer 23 are successively formed on the GaAs substrate 20 by epitaxial growth, the SiO$_2$ film 24 and the polyimide film 25 are successively deposited on the high dopant concentration n type GaAs layer 23, the Au thin film 26 and the Ti thin film 27 are formed on the polyimide film 25, and the photoresist film 28a is plated on the entire surface, as shown in FIG. 10(a). Here, the source and the drain electrodes are not illustrated, but they are already present at a prescribed region on the high dopant concentration n type GaAs layer 23.

Subsequently, the photoresist film 28a is patterned to form the photoresist mask 28 and, thereafter, a part of the Ti layer 27 exposed by this patterning is removed by RIE (reactive ion etching) using CBrF$_3$ gas, and the Ni layers 29 are selectively plated on the exposed part of the Au layer 26, as shown in FIG. 10(b).

Next, the photoresist mask 28 and the Ti layer 27 are removed as shown in FIG. 10(c) and, thereafter, a part of the polyimide layer 25 exposed to the aperture of the Ni gilding layer 29 is selectively etched by RIE using O$_2$, thereby forming a polyimide layer aperture 25a, and, further, a part of the SiO$_2$ film 24 exposed to the polyimide layer aperture 25a is selectively etched by RIE using CF$_4$ gas, thereby forming an SiO$_2$ film aperture 24a, as shown in FIG. 10(d).

A part of the high concentration n type GaAs layer 23 exposed to the SiO$_2$ film aperture 24a is etched for a recess having a depth of approximately 500 Å (50 nm), thereby forming a recess 202 as shown in FIG. 10(e) and, thereafter, the SiO$_2$ film 24, the high dopant concentration n type GaAs layer 23, and the n type GaAs layer 22 are etched to produce an undercut of about 0.6 μm, thereby forming the gate recess 201 as shown in FIG. 10(f). In this etching step, because the n type GaAs layer 23 has been previously etched as shown in FIG. 10(e), a gate recess 201 having a two-stage configuration with the first bottom surface 201a in contact with the gate electrode and positioned at the center part in the recess and the second bottom surfaces 201b not in contact with the gate electrode and positioned at a little higher position than the first bottom surface 201a at both sides of the first bottom surface is produced.

Thereafter, Ti, Pt, and Au as gate electrode materials 30a are successively evaporated as shown in FIG. 10(g), the gate electrode materials 30a are lifted-off by removing the polyimide layer 25, thereby forming the gate electrode 30, and, finally, the SiN film 31 is deposited on the entire surface as a passivation film, thereby providing the FET 200 with the two-stage recess structure as shown in FIG. 10(h).

The gate recess structure and the characteristics of the FET are related as described below in comparing a two-stage recess structure to a one-stage recess structure.

FIGS. 11(a) to 11(c) are diagrams schematically showing a two-stage recess structure, a one-stage recess structure, and a one-stage recess structure having a wide recess width in FETs, respectively. In the figures, a two-stage recess structure gate recess 310 is provided in an n type semiconductor layer 322, and has a first-stage recess 311 having an aperture width W11 with a bottom surface 311a on which a gate electrode 350 is disposed and a second stage-recess 312 having an aperture width W12 having a bottom surface 312a positioned at a higher position than the bottom surface 311a of the first-stage recess 311. Reference numerals 320 and 330 designate one-stage gate recess structures having aperture widths of W2 and W3 (>W2) and having recess bottom surfaces 320a and 330a, respectively. Reference numeral 322a designates a surface depletion layer of the n type semiconductor layer 322 having a thickness Dsd. Reference numeral 322b designates a gate depletion layer that extends farther toward the drain side along the lower surface of the surface depletion layer 322a with an increase in the gate voltage.

Because the bottom surfaces 312a of the second-stage recess 312 are positioned at both sides of the bottom surface 311a of the first-stage recess 311 on which the gate electrode 350 is disposed in the gate recess 310 as shown in FIG. 11(a), the active layer thickness Da2 at the side of the gate electrode is thicker than the active layer thickness Da at the side of the gate electrode of the gate recess 320 in the one-stage recess structure FET shown in FIG. 11(b). Therefore, the two-stage recess structure FET shown in FIG. 11(a) is unlikely to be subject to channel confinement in which the path of current flowing between the source and the drain is narrowed due to the surface depletion layer 322a at the upper surface of the n type semiconductor layer 322 as compared with the one-stage recess structure FET shown in FIG. 11(b). As a result, preferable input and output characteristics of the FET are obtained with the two-stage recess structure.

Furthermore, it is known that in the two-stage recess structure FET, even when the thickness Da1 of the n type semiconductor layer 322 at a part directly below the gate electrode is the same as the thickness Da in the one-stage recess structure FET, the active layer thickness at the source side part in the gate recess is larger than that in the one-stage recess structure FET as described above so that the source resistance is lowered as compared with the one-stage recess structure FET, improving FET performance.

Generally, the following factors are important for further improvement of high frequency and output characteristics of FETs: (1) suppression of channel confinement, (2) reduction of source resistance, and (3) improvement of gate drain breakdown voltage. The two-stage recess structure is effective in realizing (1) and (2) as described above.

It is known that the gate drain breakdown voltage greatly depends on the ratio of the thickness of the active layer at the side of a gate electrode to the thickness of a surface depletion layer at the same part and that the gate drain breakdown voltage increases with an increase in the ratio, as described in IEEE Trans. Electron Devices, Volume ED-276, 1013, 1980. Accordingly, in the two-stage recess structure, because the ratio of the surface depletion layer thickness to the active layer thickness at the side of the gate electrode (Dsd/Da2) is smaller than that ratio in the one-stage recess structure (Dsd/Da), the gate drain breakdown voltage is decreased, resulting in a problem.

More particularly, in FETs, when the voltage applied to the gate electrode 350 is increased, the gate depletion layer 322b does not extend in the thickness direction of the active layer (hereinafter referred to as vertical direction) but extends in the transverse direction. The gate drain breakdown voltage depends on the distance of the gate depletion layer 322b extending in the transverse direction, and the gate drain breakdown voltage is large when this distance is large. To be more specific, because the thickness Da2 of the active layer at the side of the gate electrode in the two-stage recess structure shown in FIG. 11(a) is larger than the thickness Da in the one-stage recess structure shown in FIG. 11(b), the distance of the gate depletion layer 322b extending in the vertical direction, i.e., a value Dgd1 which is obtained by subtracting the surface depletion layer thickness Dsd from the thickness Da2 of the active layer at the side of the gate electrode, is larger than the value Dgd (=Da–Dsd) in the one-stage recess structure shown in FIG. 11(b). Therefore, the gate depletion layer 322b is unlikely to extend in the transverse direction in the two-stage recess structure as compared with the one-stage recess structure, resulting in a low gate drain breakdown voltage.

Besides, it is generally known that the gate drain breakdown voltage is improved with an increase in recess width which is obvious from the above description. In a recess structure having a large recess width, however, when the gate drain breakdown voltage is increased, the source resistance is increased because of an increase in the recess width at the source electrode side, resulting in a problem.

More particularly, in the recess structure having the large recess width W3 as shown in FIG. 11(c), because the gate depletion layer 322b does not extend in the vertical direction and the distance Lcd3 of the gate depletion layer extending toward the drain side is longer than Lcd2 of FIG. 11(b), the gate drain breakdown voltage is high. On the other hand, because the recess width W3s at the source electrode side is larger than the W2s width of FIG. 11(b), an increase in the source resistance is induced.

Japanese Published Patent Applications 60-28275 and 4-39941 describe FETs having a gate recess structure in which a gate electrode is disposed on a concave part of an upper surface of a semiconductor substrate and has an intermediate bottom surface only at the source side of the side surface of the concave part. The intermediate bottom surface is positioned at a depth between the bottom surface of the concave part and the upper surface of the substrate.

In the FETs described in these references, the thicknesses of the active layers are large at the source side beside the gate and are small at the drain side beside the gate so that the FETs have low source resistances and no deterioration in the gate drain breakdown voltage. However, because the techniques described in the references include dry etching and ion implantation which are carried out in a diagonal direction relative to the substrate surface during the formation of the recess structure, the arrangement of the source and drain electrodes with respect to the gate electrode is restricted by the diagonal direction processes, resulting in a problem. When a high power output transistor is produced by providing a plurality of transistors, the degree of freedom in the arrangement of the source and drain electrodes is severely reduced.

More particularly, in high power output transistors, source electrodes S and drain electrodes D are arranged alternatingly and gate electrodes (hereinafter referred to as gate fingers) $G_1$ extending from a gate part G are disposed respectively between the adjacent source and drain electrodes as shown in FIG. 12(a). In the techniques described in the publications mentioned above, however, the arrangement of source and drain electrodes with respect to gate fingers is subject to restriction so that all the source and drain electrodes must be disposed at the same positions with respect to all the gate fingers; that is, each source electrode S must be disposed at the left side of a gate finger $G_1$ and each drain electrode D must be disposed at the right side of a gate finger $G_1$ as shown in FIG. 12(b), resulting in a problem that the arrangement of the source and drain electrodes is thus restricted. Moreover, this arrangement of the source and drain electrodes increases the degree of extension of the FET in the transverse direction, resulting in a possibility of deterioration in the FET characteristics.

In the prior art method of producing the two-stage recess structure, since the gate electrode is formed by evaporation and lift-off, as described in the respective publications, a refractory metal cannot be used as a gate material with the result that an FET having high reliability is not obtained. The reason for this is that the refractory metal melts at a high temperature and the high temperature of the refractory metal material in the evaporation process damages the photoresist used for lift-off.

SUMMARY OF THE INVENTION

It is an object of the present invention to provide a semiconductor device having high reliability in which a reduction in the source resistance is accomplished without deterioration of the gate drain breakdown voltage, and, further, without deterioration of the characteristics due to the arrangement of source and drain electrodes with respect to a gate electrode.

It is another object of the present invention to provide a method of producing a semiconductor device by which an FET having a low source resistance and no deterioration of the gate drain breakdown voltage is produced without being restricted in the arrangement of source and drain electrodes with respect to a gate electrode by the production process and, further, using a refractory metal as the gate electrode material.

It is still another object of the present invention to provide a semiconductor device in which a reduction in the source resistance as well as an improvement of the gate drain breakdown voltage is accomplished.

It is still another object of the present invention to provide a method of producing a semiconductor device by which an FET having a low source resistance is produced while controlling the gate drain breakdown voltage of the FET.

It is still another object of the present invention to provide a semiconductor device in which a reduction in the source resistance is achieved while suppressing deterioration of the gate drain breakdown voltage and, further, while relaxing channel confinement.

It is still another object of the present invention to provide a method of producing a semiconductor device by which an FET having a low source resistance is produced while controlling deterioration of the gate drain breakdown voltage and suppressing channel confinement, which are in a trade-off relationship, and, further, using a refractory metal as the gate electrode material.

Other objects and advantages of the present invention will become apparent from the detailed description given hereinafter; it should be understood, however, that the detailed description and specific embodiments are given by way of illustration only since various changes and modifications within the scope of the invention will become apparent to those skilled in the art from this detailed description.

According to a first aspect of the present invention, a semiconductor device comprises a plurality of source electrodes and drain electrodes which are alternatingly arranged on a semiconductor layer and a plurality of gate electrodes, each of which is disposed in a gate recess formed by selectively etching a region of the upper surface of the semiconductor layer between each of the adjacent source and drain electrodes and the gate recess has a structure having a second bottom surface only at the source side of the gate recess, the second bottom surface being positioned at a depth between a first bottom surface in contact with the gate electrode and the upper surface of the semiconductor layer and not in contact with the gate electrode. Therefore, the thickness of the semiconductor layer at a part under the gate recess, that is, the thickness of the active layer, is increased only at the source side, with a reduction in the source resistance due to an increase in the thickness of the active layer at the source side while avoiding deterioration of the gate drain breakdown voltage due to an increase in the thickness of the active layer at the drain side. Further, because the gate electrodes are disposed at the respective regions of the upper surface of the semiconductor layer between the source and the drain electrodes which are alternatingly arranged, there is attained an optimum layout of the respective electrodes in which the length of the arranged elements in the electrode arrangement direction is minimized, thereby realizing an element structure of high reliability without deterioration of characteristics due to an increase in the dimensions of the elements in the electrode arrangement direction.

According to a second aspect of the present invention, a production method comprises forming a recess by selectively etching a region of an upper surface of a certain conductivity type semiconductor layer where a gate electrode is to be disposed and selectively etching to the internal surface of the recess using a side wall which is left only at the source side inside the recess as a mask, thereby forming a gate recess having a second bottom surface only at the source side of the gate recess. The second bottom surface is positioned at a higher position than a first bottom surface in contact with the gate electrode and is not in contact with the gate electrode. Therefore, the gate recess is formed without employing diagonal etching or ion implantation. Thereby, an FET having a low source resistance and no deterioration of the gate drain breakdown voltage is produced without a restriction on the arrangement of the source and the drain electrodes with respect to the gate electrode in the production process.

According to a third aspect of the present invention, the above-described production method comprises, after forming the gate recess, depositing gate electrode materials on the entire surface and selectively removing the gate electrode materials using a mask layer formed thereon, thereby forming a gate electrode. Thus, since the mask layer for the gate electrode materials is formed after evaporation of the gate electrode materials, the mask layer is not exposed to the evaporation with the result that a refractory metal, which is evaporated at a high temperature, may be employed as the gate electrode material.

According to a fourth aspect of the present invention, a semiconductor device comprises source electrodes and drain electrodes disposed on an upper surface of a certain conductivity type semiconductor layer at prescribed intervals and gate electrodes respectively disposed in gate recesses. Each of the gate recesses is formed by etching each region of the upper surface of the semiconductor layer between the source and the drain electrodes and has a structure having a second bottom surface only at the source side of the gate recess. The second bottom surface is positioned at a depth between a first bottom surface in contact with the gate electrode and the upper surface of the semiconductor layer and is not in contact with the gate electrode. The distance from the drain side of the recess aperture to the drain side of the gate electrode is larger than the distance from the source side of the recess aperture to the source side of the gate electrode. Therefore, the source resistance is reduced because of an increase in the thickness of the active layer at the source side and, moreover, the gate drain breakdown voltage is enhanced because the width of the gate depletion layer extending toward the drain side without extending in the thickness direction of the active layer is increased.

According to a fifth aspect of the present invention, a production method comprises forming a recess by etching a part of a certain conductivity type semiconductor layer where a gate electrode is to be disposed to expose a semiconductor thin film included in the semiconductor layer having a different composition from that of the semiconductor layer and, thereafter, using a first side wall remaining only at the source side, inside the recess, as a mask, transverse direction etching the semiconductor layer on the semiconductor thin film and vertical direction etching the semiconductor thin film and the semiconductor layer located therebelow, successively, thereby forming a gate recess having a two-stage structure with a second bottom surface only at the source side of the gate recess, at a higher position than the first bottom surface that is in contact with the gate electrode, the second bottom surface not contacting the gate electrode. Therefore, upon the formation of the gate recess, the distance from the drain side of the recess aperture to the drain side of the gate electrode is easily controlled by the selective transverse direction etching of the semiconductor thin film.

According to a sixth aspect of the present invention, a semiconductor device comprises source electrodes and drain electrodes disposed on a certain conductivity type semiconductor layer at prescribed intervals and gate electrodes respectively disposed in gate recesses formed by etching regions of the upper surface of the semiconductor layer between the source and drain electrodes. Each gate recess has the two-stage structure having a second bottom surface at the source side and the drain side of the gate recess, positioned at a depth between a first bottom surface that is in contact with the gate electrode and the upper surface of the semiconductor layer, and not in contact with the gate electrode. In this structure, the distance from the drain side of this second bottom surface to the gate side is larger than the distance from the source side of the second bottom surface to the gate side. Therefore, the source resistance is reduced because of an increase in the thickness of the active layer at the source side and, further, channel confinement is relaxed because of an increase in the thickness of the active layer at the drain side and deterioration of the gate drain breakdown voltage due to an increase in the thickness of the active layer at the drain side is suppressed because the distance from the drain side of the second bottom surface to the gate side is larger than the distance from the source side of the second bottom surface to the gate side.

According to a seventh aspect of the present invention, a method of producing a semiconductor device comprises forming a recess by etching a part of a certain conductivity type semiconductor layer where a gate electrode is to be disposed to expose a semiconductor thin film included in the semiconductor layer and having a different composition from that of the semiconductor layer and, thereafter, etching the semiconductor layer on the semiconductor thin film in the transverse direction using a first side wall remaining only at the source side, inside the recess, as a mask and, further, etching the semiconductor thin film and the semiconductor layer located therebelow in the recess, successively, using second side walls in the recess as a mask, thereby forming a gate recess having the two-stage recess structure with second bottom surfaces at the source side and the drain side of the gate recess, positioned at a higher position than a first bottom surface that is in contact with the gate electrode, the second bottom surface not being in contact with the gate electrode and in which structure the distance from the drain side of this second bottom surface to the gate side thereof is larger than the distance from the source side of the second bottom surface to the gate side. Therefore, upon the formation of the gate recess, the distance from the drain side of the second bottom surface to the gate side is controlled by the etching of the n type GaAs layer on the AlGaAs thin film. Thereby deterioration of the gate drain breakdown voltage and suppression of channel confinement, which are in a trade-off relationship to each other in connection with the thickness of the active layer at the drain side of the gate recess, are adjusted appropriately with the result that an FET having a desired output characteristic is easily produced.

BRIEF DESCRIPTION OF THE DRAWINGS

FIGS. 7(a) and 7(b) are cross-sectional views illustrating a structure of an FET as a semiconductor device in accordance with a third embodiment of the present invention.

DETAILED DESCRIPTION OF PREFERRED EMBODIMENTS

Embodiment 1

Figure 1A:
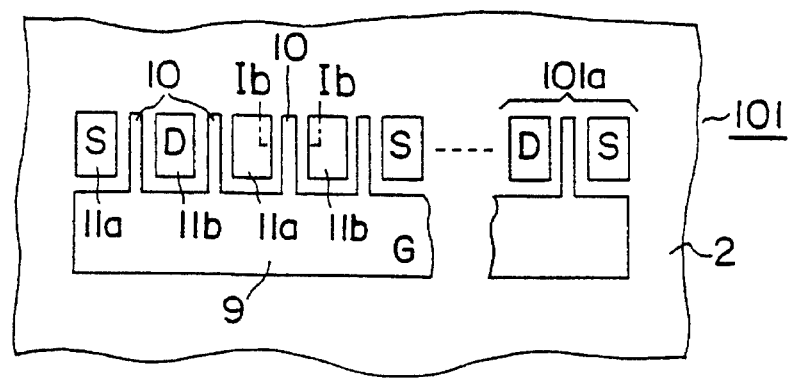
FIGS. 1(a)–1(c) are diagrams for describing a high output transistor as a semiconductor device in accordance with a first embodiment of the present invention.
Figure 1B:
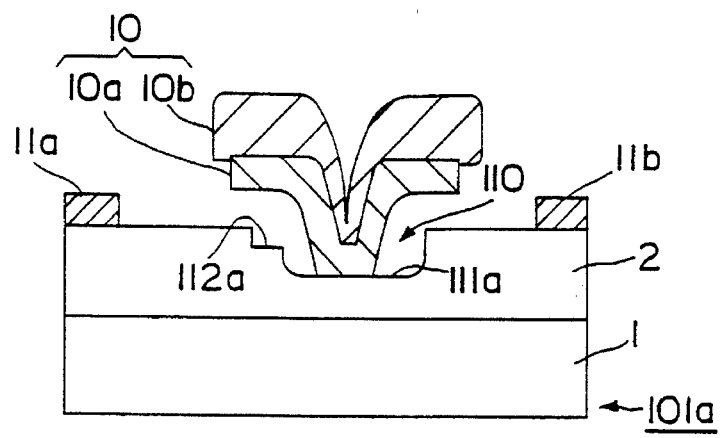
Figure 1C:
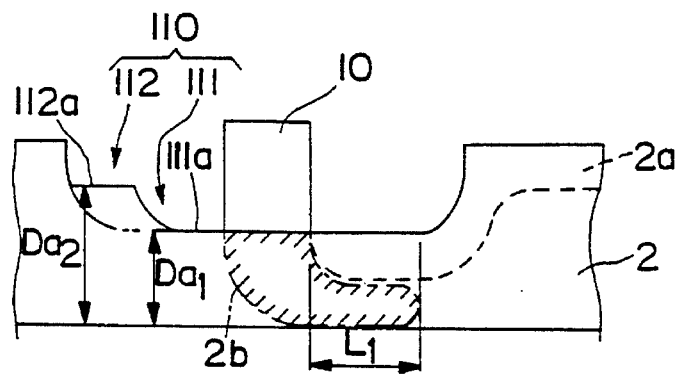

FIGS. 1(a)–1(c) are views for describing a high output transistor comprising a plurality of FET elements as a semiconductor device in accordance with a first embodiment of the present invention where FIG. 1(a) is a plan view, FIG. 1(b) is a cross-sectional view of FIG. 1(a) along a line 1b—1b, and FIG. 1(c) is an enlarged schematic view illustrating a gate recess part of the FET element. FIGS. 2(a)–2(f) and FIGS. 3(a)–3(i) are views for describing a method of producing the transistor where FIGS. 2(a)–2(f) illustrate a production flow from an n type semiconductor layer formation process to a process of forming a concave groove in the semiconductor layer and FIGS. 3(a)–3(i) illustrate forming a gate recess by selective etching of an internal surface of the concave groove, forming a gate electrode in the gate recess, and forming source and drain electrodes.

In the figures, reference numeral 101 designates a high output transistor comprising a plurality of FET elements 101a. An n type GaAs layer 2 having a dopant impurity concentration of approximately $3 \times 10^{17}/cm^3$ is disposed on a semi-insulating GaAs substrate 1 and source electrodes 11a and drain electrodes 11b are alternatingly disposed on the n type GaAs active layer 2 at prescribed intervals. The n type GaAs layer 2 has gate recesses 110 that are formed by etching the respective surface regions of the n type GaAs layer 2 between the adjacent source and drain electrodes. Gate electrodes (gate fingers) 10 extending from a gate part 9 are centrally disposed in the respective gate recesses 110.

The gate recess 110 has an asymmetrical two-stage recess structure having a second recess bottom surface 112a only at the source side of the side surface of the gate recess. The second recess bottom surface is positioned at a higher position relative to the substrate 1 than a first recess bottom surface 111a in contact with the gate electrode 10 and is not in contact with the gate electrode 10. The gate electrode 10 includes a Schottky metal 10a which comprises tungsten silicide (WSi) and which forms a Schottky contact with the n type GaAs layer 2 and a low resistance metal 10b comprising gold (Au) having a low resistance disposed on the Schottky metal 10a. The source and the drain electrodes 11a and 11b are ohmic electrodes comprising AuGe/Ni/Au.

Second side walls 8 are provided for determining the position of the gate electrode 10 in the gate recess 110. A second insulating film 4a comprising an $SiO_2$ film 4 is provided as a mask during formation of a second recess 112. A first insulating film 3a comprising an SiN film 3 is provided as a mask during formation of a first recess 111. A source side side wall 6a and a drain side side wall 6b are formed in the second recess 112 and comprise an $SiO_2$ film 6. A second photoresist film 7 is provided as an etching-mask during selective etching of the drain side side wall 6b and the drain side part of the second insulating film 4a. A WSi layer 10a1 and an Au layer 10b1 are provided for forming the Schottky metal 10a of the gate electrode 10 and the low resistance metal 10b thereof, respectively.

Figure 2A:
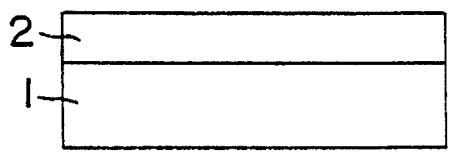
FIGS. 2(a)–2(f) are diagrams illustrating process steps in a method of producing a high output transistor in accordance with the first embodiment from an n type semiconductor layer formation process to a process of forming a recess by selectively etching a region of the semiconductor layer where a gate electrode is to be formed.

First, n type GaAs is grown on the semi-insulating GaAs substrate 1 approximately 4000 Å (400 nm) thick by epitaxial growth and, thereafter, the n type GaAs, other than a part at the element region where an FET element is to be produced, is removed by etching or made insulating by ion implantation, thereby forming the n type GaAs layer 2, as shown in FIG. 2(a).

Figure 2B:
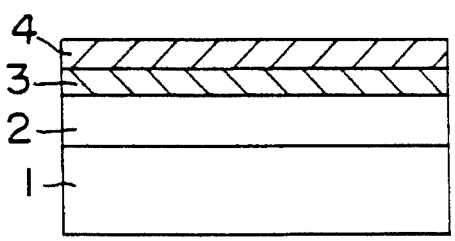
Figure 2C:
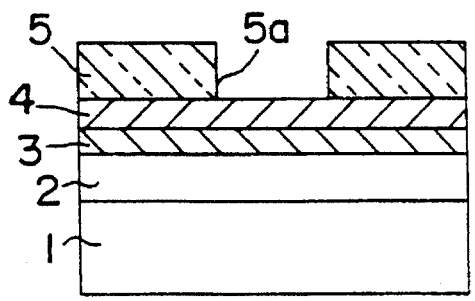

Next, the SiN film 3 and the $SiO_2$ film 4 are successively deposited on the entire surface by the plasma CVD method to thicknesses of approximately 1500 Å (150 nm), respectively, as shown in FIG. 2(b). A photoresist film 5 is formed on the $SiO_2$ film 4 with a photoresist aperture 5a at a position which corresponds to a part of the n type GaAs layer 2 where the gate recess 110 is to be formed, as shown in FIG. 2(c).

Figure 2D:
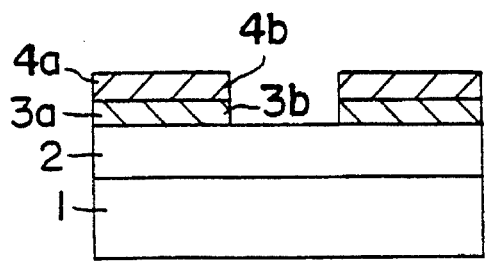

Subsequently, the $SiO_2$ film 4 and the SiN film 3 are successively anisotropically reactive ion etched using the photoresist film 5 as a mask, thereby forming the second and the first insulating films 4a and 3a which have apertures 4b and 3b, respectively, as shown in FIG. 2(d).

Figure 2E:
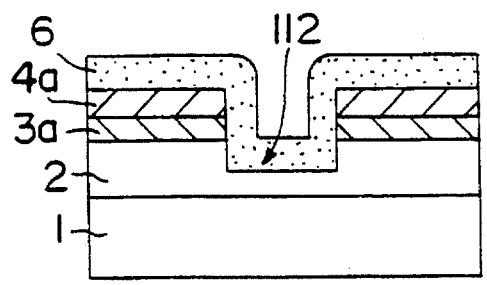

Thereafter, the n type GaAs layer 2 is anisotropically dry etched or wet etched using the second insulating film 4a as a mask to form the second recess 112 having a depth of approximately 2500 Å (250 nm) and, thereafter, the $SiO_2$ film 6 approximately 5000 Å (500 nm) thick is deposited on the entire surface, as shown in FIG. 2(e). Here, FIG. 2(e) shows that the second recess 112 is formed by dry etching.

Figure 2F:
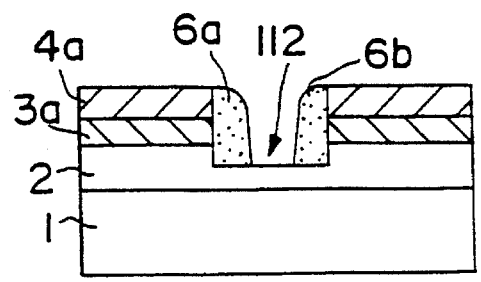

Next, the $SiO_2$ film 6 is anisotropically reactive ion etched using a mixture of $CHF_3$ and $O_2$, thereby forming the side walls 6a and 6b inside the second recess 112, as shown in FIG. 2(f).

Figure 3A:
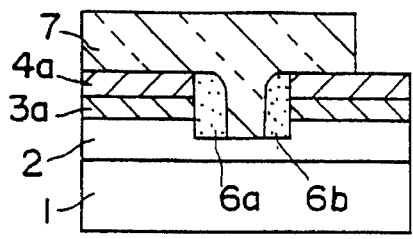
FIGS. 3(a)–3(i) are diagrams illustrating process steps in forming a gate recess by processing the recess and forming a gate electrode and source and drain electrodes in the production of a high output transistor according to the first embodiment.

Photoresist is applied to the entire surface and is patterned, thereby forming the second photoresist film 7 covering the entire surface except a part of the second insulating film 4a at the drain side, as shown in FIG. 3(a). The drain side part of the second insulating film 4a and the drain side side wall 6b are removed selectively, relative to the first insulating film 3a and the n type GaAs layer 2, by wet etching using buffered HF in aqueous solution, employing the second photoresist film 7 as a mask, as shown in FIG. 3(b).

Figure 3F:
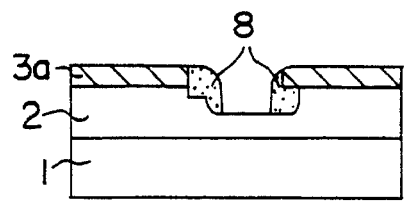
Figure 3B:
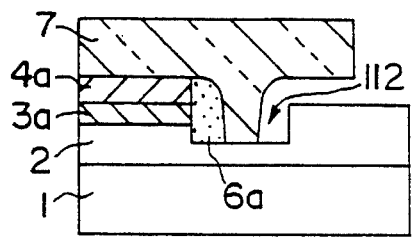
Figure 3G:
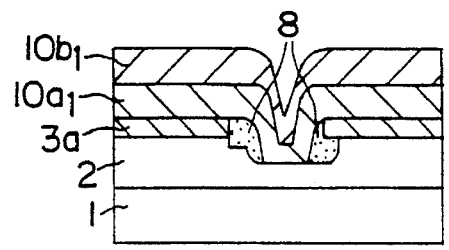
Figure 3C:
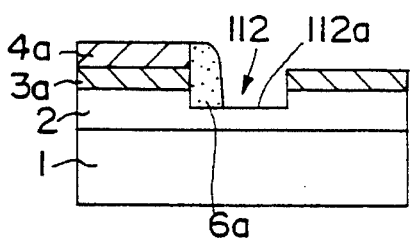
Figure 3H:
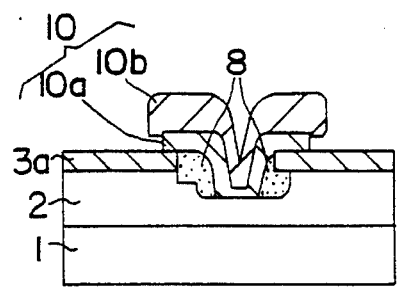
Figure 3D:
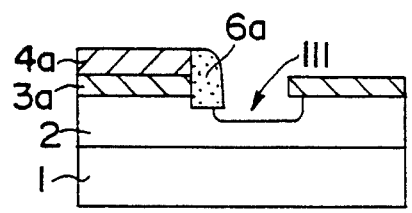

Subsequently, the second photoresist film 7 is removed, as shown in FIG. 3(c), and, thereafter, the exposed part of the bottom surface 112a of the second recess 112 is isotropically dry etched or wet etched, selectively, to etch the second recess bottom surface 112a to a depth of approximately 500 Å (50 nm) using the first and second insulating films 3a and 4a and the source side side wall 6a as a mask, thereby forming the first recess part 111. Thus, there is formed the gate recess 110 having an asymmetrical two-stage recess structure that has the second recess bottom surface 112a only at the source side of the side surface of the gate recess, which second recess bottom surface 112a is higher than the first recess bottom surface 111a relative to the substrate 1 and is not in contact with the gate electrode 10, as shown in FIG. 3(d).

Figure 3I:
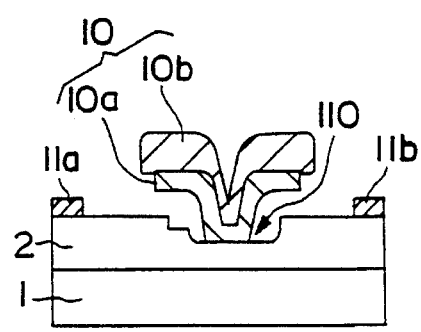
Figure 3E:
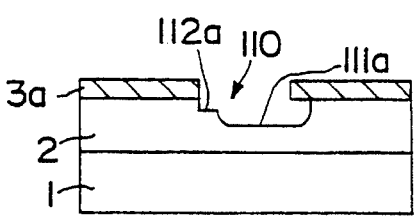

Next, the second insulating film 4a and the source side side wall 6a are removed with buffered HF in aqueous solution, as shown in FIG. 3(e), and, further, the second side walls 8 are formed inside the gate recess 110 as shown in FIG. 3(f). Thereafter, the gate electrode 10 and the source and the drain electrodes 11a and 11b are formed as shown in FIGS. 3(g) to 3(i).

More particularly, the WSi layer 10a1 and the Au layer 10b1 are successively formed on the entire surface by sputtering, as shown FIG. 3(g). Thereafter, employing a prescribed mask (not illustrated) which is formed thereon, the Au layer 10b1 is selectively removed by ion milling and the WSi layer 10a1 is selectively removed by reactive ion etching using a mixture of $CF_4$ and $O_2$, thereby forming the gate electrode 10, as shown in FIG. 3(h).

At last, AuGe, Ni, and Au are successively deposited, and they are alloyed by heat treatment to form the source and the drain ohmic electrodes 11a and 11b at both sides of the gate recess 110 on the n type GaAs layer 2, as shown in FIG. 3(i), thereby completing the high output transistor 101 comprising a plurality of the FET elements 101a.

In the high output transistor 101 of this first embodiment having the above-described structure, the gate recess 110 of each FET element has an asymmetrical two-stage recess structure having the second recess bottom surface 112a only at the source side of a side surface of the gate recess 110. The second recess bottom surface is higher relative to the substrate 1 than the first recess bottom surface 111a that is in contact with the gate electrode 10 and the second bottom surface is not in contact with the gate electrode 10. Therefore, as shown in FIG. 1(c), the thickness of the n type GaAs layer 2 at the part under the gate recess 110, i.e., the thickness Da2 of the active layer, is increased only at the source side region as compared with Da1 in the one-stage recess structure which is illustrated with a broken line, resulting in a reduction in the source resistance because of an increase in the thickness of the active layer at the source side while avoiding deterioration of the gate drain breakdown voltage due to an increase in the thickness of the active layer at the drain side.

Further, in the high output transistor 101, the source and the drain electrodes 11a and 11b are alternatingly arranged on the n type GaAs layer 2, and the gate electrodes 10 are respectively disposed at the regions of the n type GaAs layer 2 between these adjacent electrodes. Therefore, there is realized an optimum layout of the respective electrodes in which the length of the arranged elements in the electrode arrangement direction is minimized, resulting in high reliability with no possibility of deterioration of characteristics due to an increase in the dimension of the transistor in the electrode arrangement direction.

Moreover, in the method of this first embodiment, after the side walls 6a and 6b are formed inside the second recess 112, which is formed by etching a prescribed region of the upper surface of the n type GaAs layer 2, the second recess bottom surface 112a is selectively etched using the side wall 6a remaining only at the source side in the second recess 112 as a mask. Therefore, the gate recess 110 having the second recess bottom surface 112a only at the source side of the gate recess, higher than the first recess bottom surface 111a in contact with the gate electrode 10, is not in contact with the gate electrode 10, and is formed without employing diagonal direction etching or diagonal direction ion implantation, thereby resulting in the high output transistor 101 comprising a plurality of the FET elements 101a having a low source resistance and no deterioration of the gate drain breakdown voltage and without any restriction in the production process on the arrangement of the source and drain electrodes with respect to the gate electrode.

Further in the production method of this embodiment, after the gate recess 110 is formed, the gate electrode materials 10a1 and 10b1 are deposited on the entire surface and are selectively removed using a mask formed thereon, thereby forming the gate electrode 10. Thus, since the mask layer for forming the gate electrode is formed after evaporation of the gate electrode materials, the mask layer is not exposed to the temperature of evaporation of the gate metal. Therefore, a refractory metal which evaporates at a high temperature is used as the gate electrode material with the result that a transistor having high reliability and no deterioration of the characteristics due to the mutual diffusion of a dopant impurity between the n type GaAs layer 2 and the gate low resistance metal 10b of the gate electrode 10 is produced.

In addition, in the above-described production method, because the recess bottom surface is selectively etched using the side wall formed inside the recess, a transistor having the gate recess 110 of the above-described structure is produced with a favorable yield.

Embodiment 2

Figure 4A:
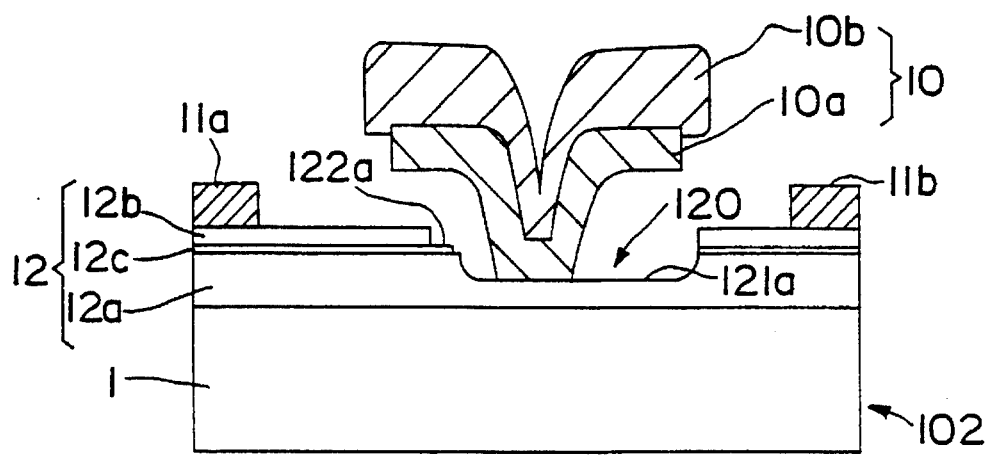
FIGS. 4(a) and 4(b) are cross-sectional views illustrating a structure of an FET as a semiconductor device in accordance with a second embodiment of the present invention.
Figure 4B:
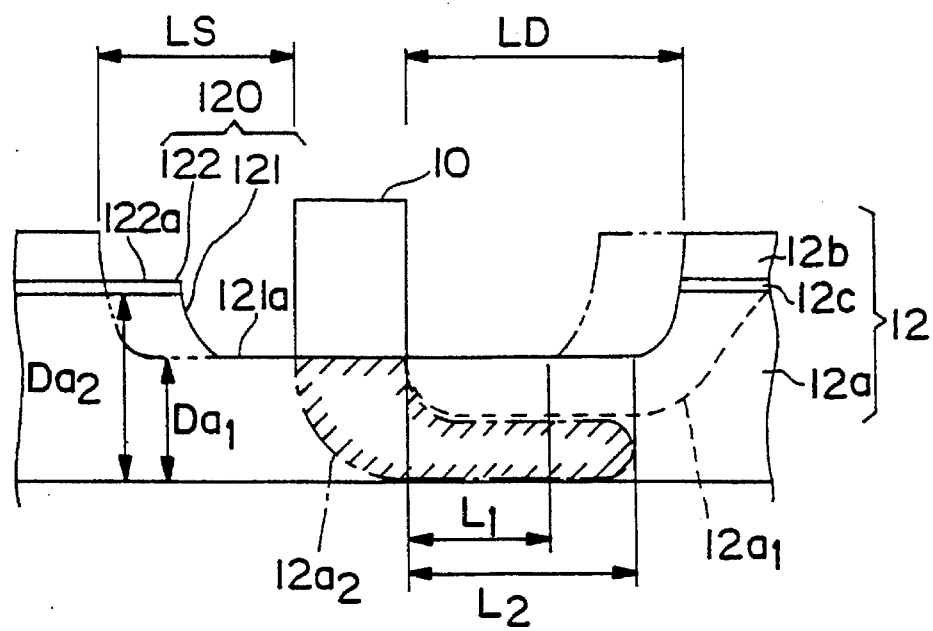

FIGS. 4(a) and 4(b) are views for describing an FET as a semiconductor device in accordance with a second embodiment of the present invention where FIG. 4(a) is a cross-sectional view of the FET and FIG. 4(b) is an enlarged schematic cross-sectional view illustrating a gate recess of the FET. FIGS. 5(a)–5(i) and FIGS. 6(a)–6(g) are views for describing a method of producing the transistor where FIGS. 5(a)–5(i) are views illustrating a production flow from an n type GaAs layer formation process to a first recess formation process and FIGS. 6(a)–6(g) are cross-sectional views illustrating forming of a gate recess by etching the internal surface of the first recess and forming a gate electrode and source and drain electrodes.

In the figures, reference numeral 102 designates an FET according to this second embodiment in which the asymmetrical two-stage recess structure of the first embodiment is altered to have an offset gate structure.

More particularly, in this transistor 102, a gate recess 120 has a structure having a second recess bottom surface 122a only at the source side of the gate recess. The second recess bottom surface is positioned higher relative to the substrate 1 than a first recess bottom surface 121a and is not in contact with the gate electrode 10. The distance LD from the drain side of the gate recess aperture to the drain side of the gate electrode 10 is larger than the distance LS from the source side of the gate recess aperture to the source side of the gate electrode 10.

An n type layer 12 of this transistor 102 includes a lower GaAs layer 12a formed on a semi-insulating GaAs substrate 1, an AlGaAs thin film 12c about 50 Å (5 nm) thick on the GaAs layer 12a, and an upper GaAs layer 12b on the AlGaAs thin film 12c. The remaining construction of the transistor 102 is the same as that of the FET of the first embodiment and reference numeral 12a1 designates a surface depletion layer and reference numeral 12a2 designates a gate depletion layer.

Figure 5A:
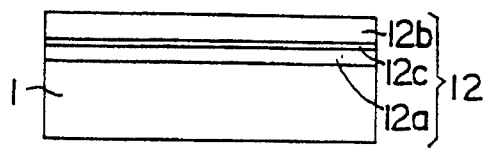
FIGS. 5(a)–5(i) are diagrams illustrating process steps in a method of producing an FET according to the second embodiment from an n type semiconductor layer formation process to a process of forming a recess by selectively etching a region of the semiconductor layer where a gate electrode is to be formed.

First, as shown in FIG. 5(a), n type GaAs as the lower semiconductor layer 12a approximately 1500 Å (150 nm) thick is grown on the semi-insulating GaAs substrate 1 by epitaxial growth and, successively, $Al_xGa_{1-x}As$ (x=0.2 to 0.4) about 50 Å (5 nm) thick is grown to form the AlGaAs thin film 12c as an etch stopping layer and, further, the upper n type GaAs layer 12b, approximately 2500 Å (250 nm) thick, is formed by growing n type GaAs. Thereafter, as in the first embodiment, element separation is carried out to form an n type active layer 12 at the element region. Here, an InGaAs thin film may be used as the etch stopping layer in place of the AlGaAs thin film.

Figure 5B:
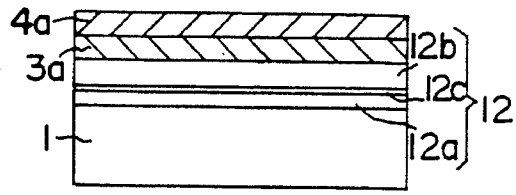
Figure 5C:
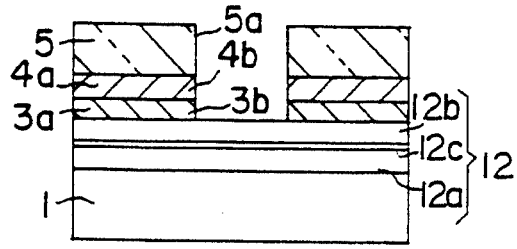

Thereafter, the same processes as those shown in FIGS. 2(b) to 2(d) of the first embodiment are carried out, forming first and second insulating films 3a and 4a respectively having apertures 3b and 4b on a part of the n type layer 12 where the gate recess is to be formed, as shown in FIGS. 5(b) and 5(c).

Figure 5D:
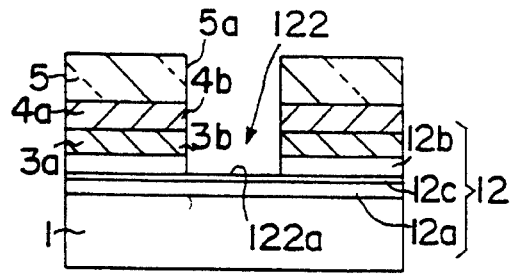
Figure 5E:
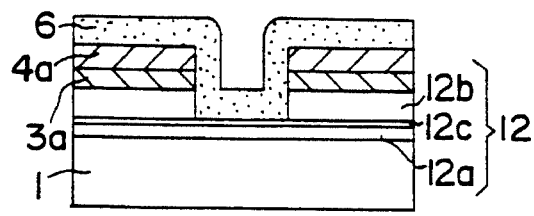
Figure 5F:
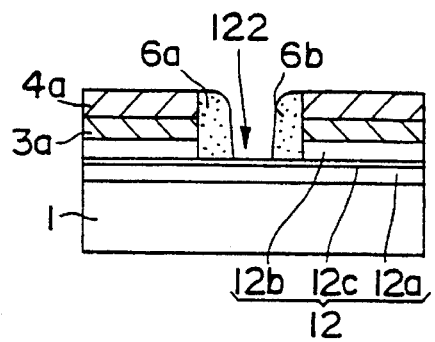
Figure 5G:
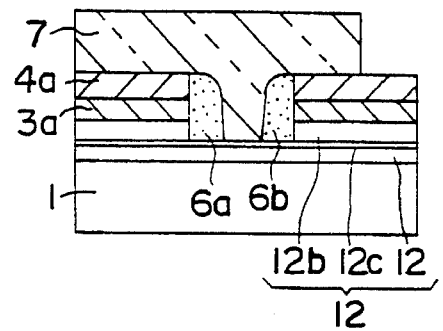
Figure 5H:
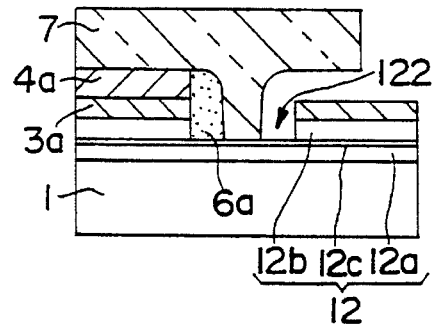
Figure 5I:
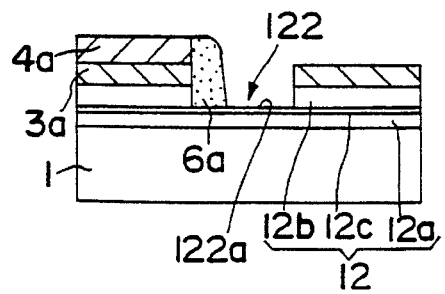

Next, in this second embodiment, the upper GaAs layer 12b is dry-etched to expose the AlGaAs thin film 12c using the second insulating film 4a as a mask to form a second recess 122, as shown in FIG. 5(d). Then, RIE using $SF_6$ and $Cl_2$ gases is adopted, whereby the upper GaAs layer 12b is removed with high selectivity relative to the AlGaAs thin film 12c.

Next, the same processes as those shown in FIGS. 2(e) and 2(f) and FIGS. 3(a)–3(c) of the first embodiment are carried out, thereby forming a side wall 6a only at the source side on the second recess bottom surface 122a, as shown in FIGS. 5(e)–5(i).

Figure 6A:
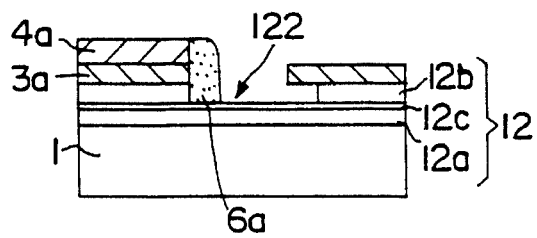
FIGS. 6(a)–6(g) are diagrams illustrating process steps of forming a gate recess by processing the recess and forming a gate electrode and source and drain electrodes in the production of an FET according to the second embodiment.

After that, in this embodiment, the upper GaAs layer 12b on the AlGaAs thin film 12c is undercut by high selectivity RIE using $SF_6$ and $Cl_2$ gases employing the source side side wall 6a as a mask; that is, the upper GaAs layer 12b is etched in the transverse direction toward the drain side, as shown in FIG. 6(a). Because the selectivity of the GaAs layer relative to the AlGaAs thin film is high, the n type layer 12 is not etched in the depth direction.

Figure 6B:
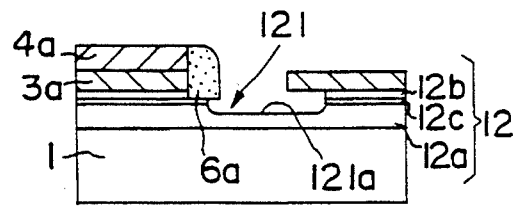

Next, the AlGaAs thin film 12c and the GaAs layer 12a located therebelow are successively wet etched using the first and the second insulating films 3a and 4a and the source side side wall 6a as a mask to deepen the second recess, moving the second recess bottom surface 122a by approximately 500 Å (50 nm), thereby forming a first recess 121. Thus, the gate recess 120 having the second recess bottom surface 122a only at the source side of the side surface of the gate recess 120 at a higher position than the first recess bottom surface 121a relative to the substrate 1 is not in contact with the gate electrode 10, as shown in FIG. 6(b).

Figure 6C:
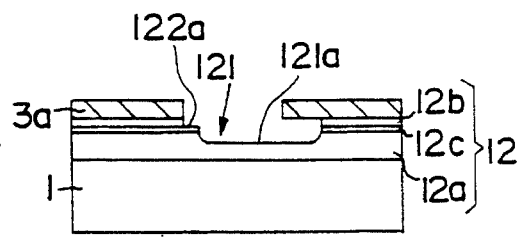
Figure 6D:
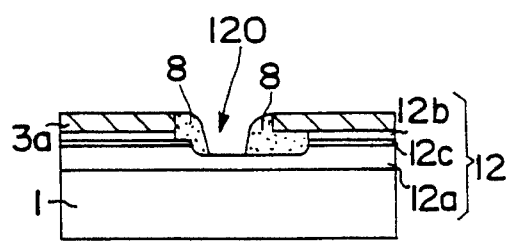

Successively, the second insulating $SiO_2$ film 4a and the source side side wall $SiO_2$ film 6a are removed selectively relative to the first insulating SiN film 3a using buffered HF in aqueous solution, as shown in FIG. 6(c), and, thereafter, second side walls 8 are formed inside the gate recess 120 by the same method as that for forming the first side walls 6a and 6b, as shown in FIG. 6(d).

Figure 6E:
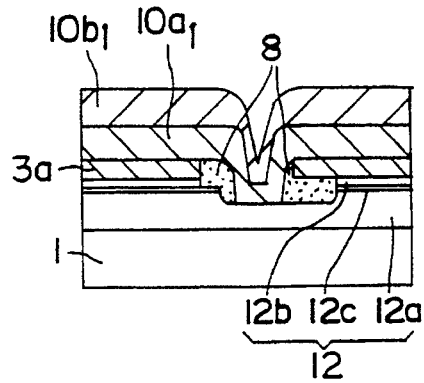
Figure 6F:
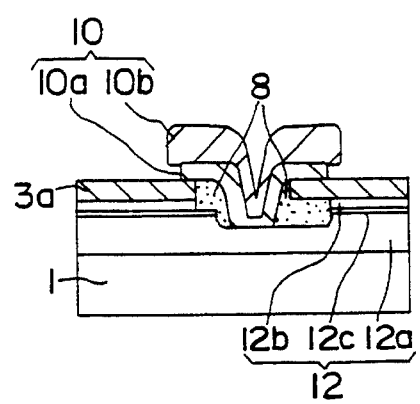

Thereafter, the same processes as those shown in FIG. 3(g) and FIG. 3(h) of the first embodiment are carried out, thereby forming the gate electrode 10, as shown in FIGS. 6(e) and 6(f). Then, the position of the gate electrode 10 is determined by the second side walls 8 so that the distance LD from the drain side edge of the gate electrode 10 to the drain side aperture of the gate recess 120 is larger than the distance LS from the source side edge of the gate electrode 10 to the source side aperture of the gate recess 120.

Figure 6G:
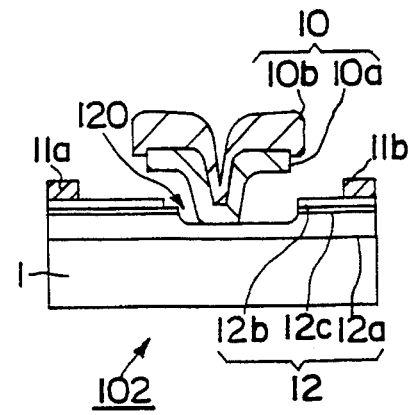

At last, source and drain electrodes 11a and 11b are formed, as in the process shown in FIG. 3(i), thereby completing the FET 102 of this second embodiment, as shown in FIG. 6(g).

As described above, in this second embodiment, because the gate recess 120 has a structure in which the distance LD from the drain side of the gate recess aperture to the drain side edge of the gate electrode 10 is larger than the distance LS from the source side of the gate recess aperture to the source side edge of the gate electrode 10, in addition to the construction of the first embodiment, the source resistance is reduced because of an increase in the layer thickness of the active layer at the source side part (Da2–Da1). Besides, the width L2 of the gate depletion layer 12a2 extending toward the drain side without extending in the vertical direction becomes larger than L1 of the first embodiment, with a result that the gate drain breakdown voltage is improved.

In the production method of this embodiment, the part of the upper surface of the n type layer 12 where the gate electrode 10 is to be disposed is etched to expose the AlGaAs thin film 12c that is included in the n type layer 12 and has a different composition from that of the n type layer 12, thereby forming the second recess 122. Thereafter, using the first side wall 6a remaining only at the source side inside the second recess 122 as a mask, the upper n type GaAs layer 12b on the AlGaAs thin film 12c is etched in the transverse direction, and the AlGaAs thin film 12c and the GaAs layer 12a located therebelow are successively etched in the vertical direction, so that, when the gate recess 120 having the two-stage structure only at the source side of the side surface of the gate recess is formed, the distance LD from the drain side of the recess aperture to the drain side edge of the gate electrode is easily controlled by the transverse direction selective etching of the AlGaAs thin film 12c.

Embodiment 3

FIGS. 7(a) and 7(c) are views for describing an FET as a semiconductor device in accordance with a third embodiment of the present invention where FIG. 7(a) is a cross-sectional view of the FET and FIG. 7(b) is an enlarged schematic cross-sectional view illustrating a gate recess part of the FET. FIGS. 8(a)–8(h) are views for describing a production method of the FET.

In the figures, reference numeral 103 designates an FET of this third embodiment. This FET 103 comprises a gate recess 130 having second recess bottom surfaces 132a at both the source side and the drain side of the gate recess. The second recess bottom surfaces are at a higher position than a first recess bottom surface 131a relative to the substrate 1 and are not in contact with the gate electrode 10. Besides, the gate recess has an asymmetrical two-stage recess structure in which a distance LD2 from the drain side of the second bottom surface 132a to the gate side thereof is larger than a distance LS2 from the source side of the second bottom surface 132a to the gate side thereof. The other structure of the transistor 103 is the same as that of the second embodiment.

Figure 8A:
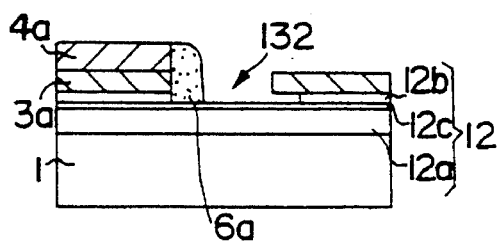
FIGS. 8(a)–8(h) are diagrams for describing a method of producing an FET according to a third embodiment of the present invention.

As described in the second embodiment, an n type layer 12 is formed on a semi-insulating GaAs substrate 1, the second recess 132 is formed at a prescribed region of the n type layer 12 and, thereafter, an upper n type GaAs layer 12b is undercut using a side wall 6a which remains only at the source side inside the second recess 132 as a mask, as shown in FIG. 8(a).

Figure 8B:
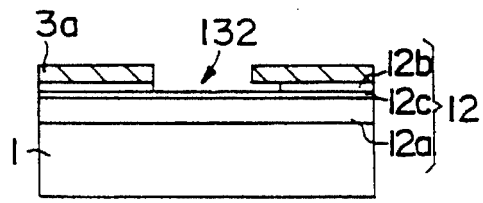
Figure 8C:
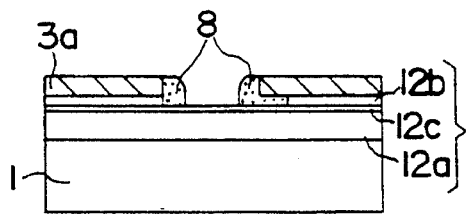

Thereafter, in this third embodiment, a second insulating SiO$_2$ film 4a and the side wall 6a are removed selectively relative to the first insulating SiN film 3a using buffered HF in aqueous solution, as shown in FIG. 8(b), and second side walls 8 are formed inside the second recess 132, as shown in FIG. 8(c).

Figure 8D:
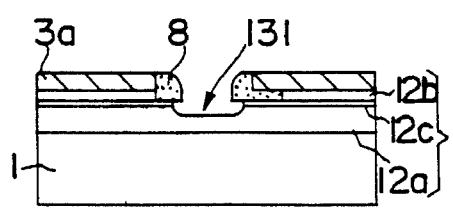
Figure 8E:
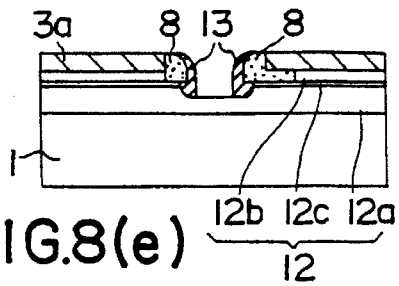

Next, an AlGaAs thin film 12c and an n type GaAs layer 12a located therebelow are successively wet etched using the second side walls 8 and the first insulating films 3a as a mask to move the second recess bottom surface 132a approximately 500 Å (50 nm) deeper, thereby forming a first recess 131. Thus, the gate recess 130 having an asymmetrical two-stage recess structure having the second recess bottom surfaces 132a at the source and the drain sides of the side surface of the gate recess 132 is formed. The second recess bottom surfaces 132a are positioned higher relative to the substrate 1 than the first recess bottom surface 131a and are not in contact with the gate electrode 10. Besides, the distance LD2 from the drain side of the second bottom surface 132a to the gate side thereof is larger than the distance LS2 from the source side of the second bottom surface 132a to the gate side thereof, as shown in FIG. 8(d).

Figure 8F:
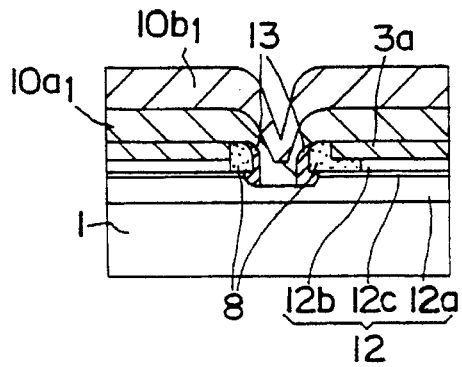
Figure 8G:
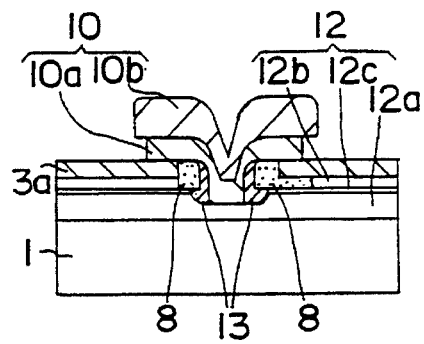
Figure 8H:
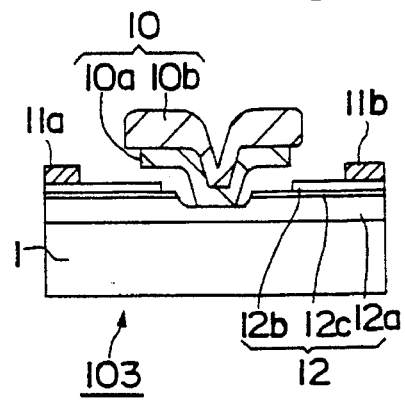
Figure 9:
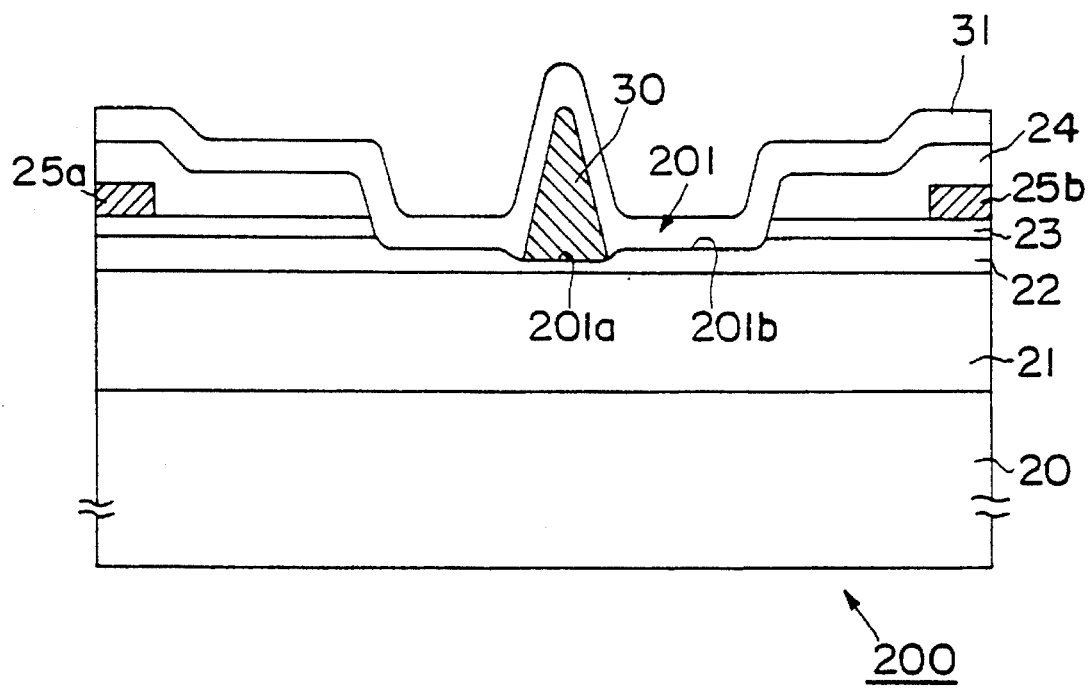
FIG. 9 is a cross-section of a prior art FET.
Figure 10A:
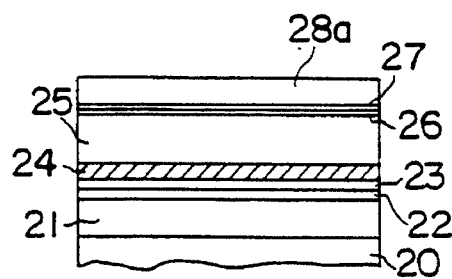
FIGS. 10(a)–10(h) are cross-sectional views for describing a method of producing the prior art FET.
Figure 10E:
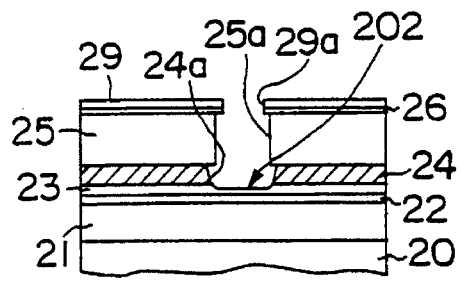
Figure 10B:
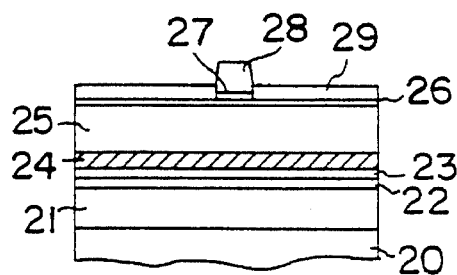
Figure 10F:
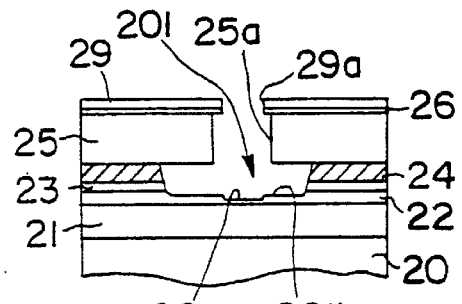
Figure 10C:
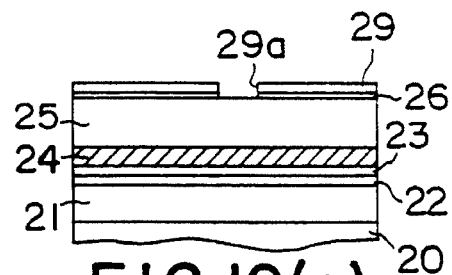
Figure 10G:
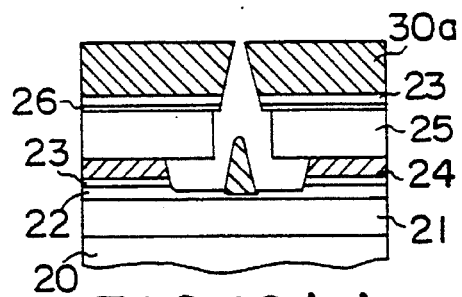
Figure 10D:
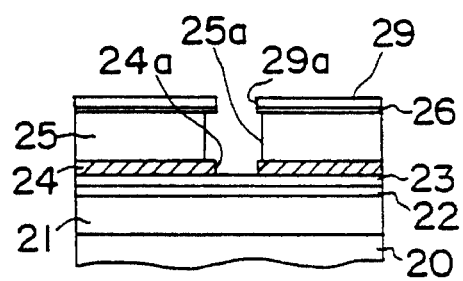
Figure 10H:
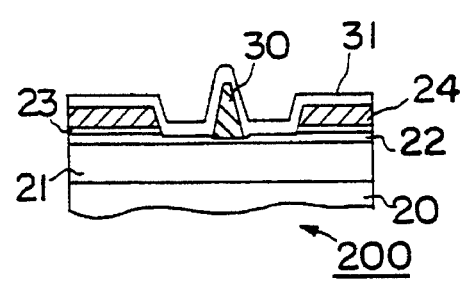
Figure 11A:
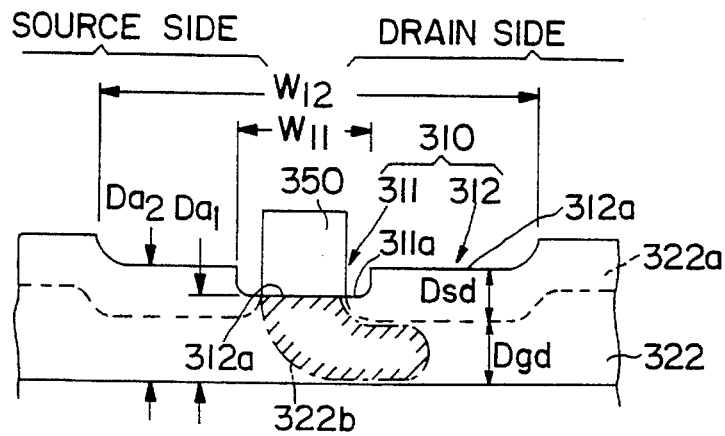
FIGS. 11(a)–11(c) are diagrams for describing the relationship between a gate recess configuration and element characteristics in a prior art FET with a two-stage recess and with a one-stage recess.
Figure 11B:
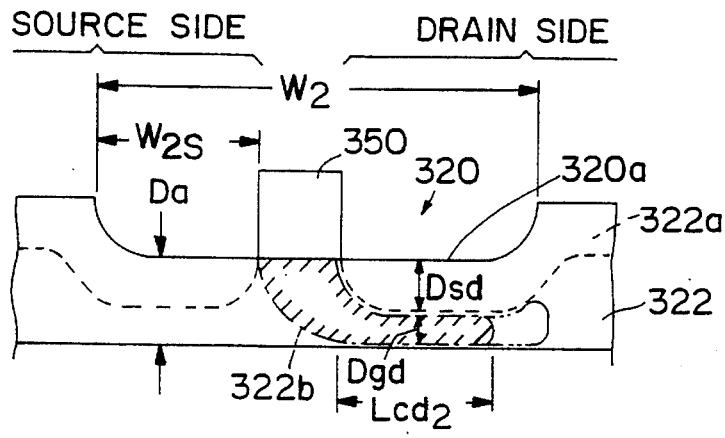
Figure 11C:
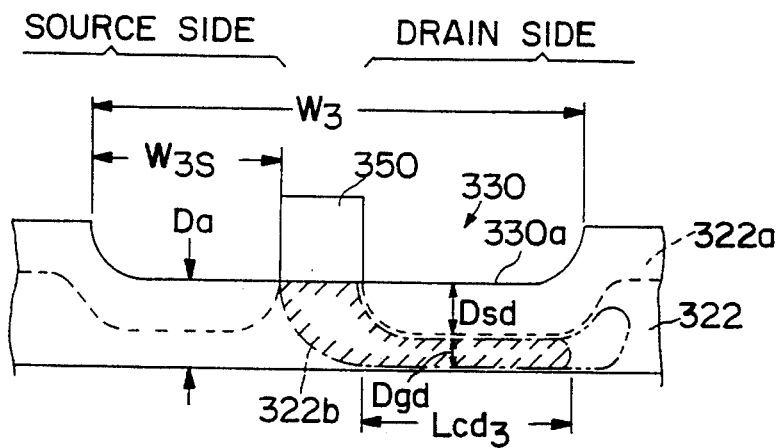
Figure 12A:
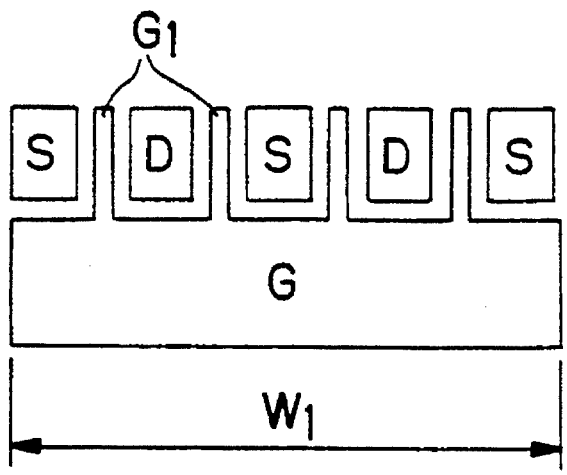
FIGS. 12(a) and 12(b) are diagrams for describing problems in FETs produced by methods described in Japanese Published Patent Applications 60-28275 and 4-39941.
Figure 12B:
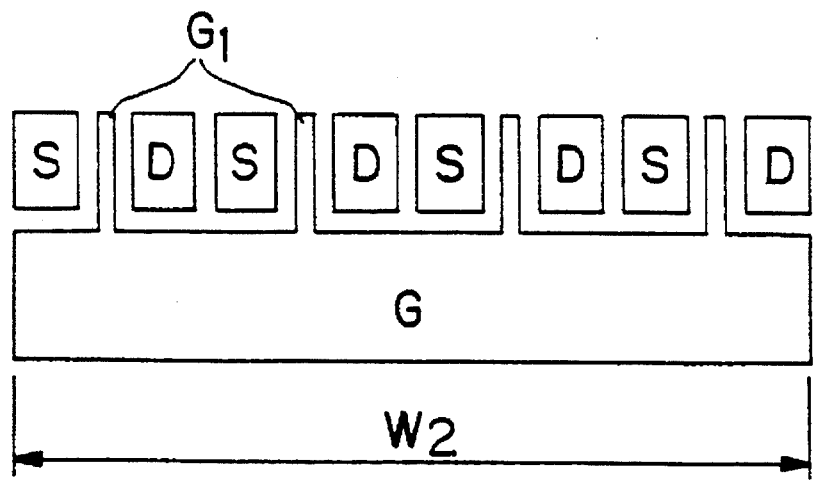

Next, third side walls 13 are formed inside the first recess 131 covering the second side walls 8 and, thereafter, the same processes as those of the first embodiment shown in FIGS. 3(g)–3(i) are carried out and the gate electrode 10 and source and drain electrodes 11a and 11b are formed, thereby completing the FET 103 of this third embodiment, as shown in FIGS. 8(f)–8(h).

As described above, in this third embodiment, because the gate recess 130 has a structure in which the second recess bottom surfaces 132a are at a higher position than the first recess bottom surface 131a relative to the substrate 1 and are not in contact with the gate electrode 10. Besides, the distance LD2 from the drain side of the second bottom surface 132a to the gate side thereof is larger than the distance LS2 from the source side of the second bottom surface 132a to the gate side thereof, the source resistance is reduced because of an increase (Da2–Da1) in the thickness of the active layer at the source side and, further, channel confinement is relaxed because of an increase (Da2–Da1) in the thickness of the active layer at the drain side. Deterioration of the gate drain breakdown voltage due to an increase in the thickness of the active layer at the drain side is suppressed by making the distance LD2 from the drain side of the second bottom surface to the gate side thereof larger than the distance LS2 from the source side of the second bottom surface to the gate side thereof.

In the production method of this embodiment, the part of the upper surface of the n type layer 12 where the gate electrode 10 is to be disposed is etched to expose the AlGaAs thin film 12c which is included in the n type layer 12 and has a different composition from that of the n type layer 12, thereby forming the second recess 122. Thereafter, using the first side wall 6a remaining only at the source side inside the second recess 122 as a mask, the upper n type GaAs layer 12b on the AlGaAs thin film 12c is etched in the transverse direction and, using the second side wall 8 which is formed in the second recess 132, the AlGaAs thin film 12c and the GaAs layer 12a located therebelow are successively etched. Therefore, upon the formation of the gate recess 130, the distance LD2 from the drain side of the second bottom surface 132a to the gate side thereof is controlled by the amount of etching of the n type GaAs layer 12b on the AlGaAs thin film 12c. Thereby, deterioration of the gate drain breakdown voltage and suppression of channel confinement, which are in a trade-off relationship to each other in connection with the thickness of the active layer at the drain side of the gate recess, are adjusted appropriately, with the result that an FET with desired output characteristics is easily produced.

What is claimed is:

1. A field effect transistor comprising:

a semi-insulating semiconductor substrate;

a first conductivity type semiconductor layer disposed on said semi-insulating semiconductor substrate and comprising a first film of a first semiconductor material contacting said semiconductor semi-insulating substrate, a second film of a second semiconductor material different from said first semiconductor material disposed on said first film, and a third film of said first semiconductor material disposed on said second film, said first conductivity type semiconductor layer having an upper surface at said third film and having a gate recess with a first bottom surface exposing part of said first film;

a gate electrode disposed in the gate recess in contact with the first bottom surface; and a source electrode and a drain electrode disposed on the upper surface of said semiconductor layer on opposite sides of the gate recess wherein the gate recess has a second bottom surface exposing part of said second film only at a side of the gate recess closest to said source electrode, the second bottom surface not contacting said gate electrode, and said gate electrode is farther from an edge of the gate recess closest to said drain electrode than from an edge of the gate recess closest to said source electrode.

2. The field effect transistor of claim 1 wherein said first semiconductor material is GaAs and said second semiconductor material is AlGaAs.

3. The field effect transistor of claim 1 wherein said gate electrode is not centrally positioned on the first bottom surface.

* * * * *